United States Patent
Baugh et al.

[19]

[11] Patent Number: 6,114,674

[45] Date of Patent: Sep. 5, 2000

[54] MULTILAYER CIRCUIT BOARD WITH ELECTRICALLY RESISTIVE HEATING ELEMENT

[75] Inventors: Walter Thomas Baugh, Knoxville, Tenn.; Stephen Mark Kusek, Owens Cross Roads; Francis Wessling, III, Madison, both of Ala.

[73] Assignee: McDonnell Douglas Corporation, St. Louis, Mo.

[21] Appl. No.: 08/943,948

[22] Filed: Oct. 3, 1997

Related U.S. Application Data

[60] Provisional application No. 60/027,619, Oct. 4, 1996.

[51] Int. Cl.$^7$ .............................. H05B 3/16; H05B 1/00; H05K 1/00; H01C 1/012
[52] U.S. Cl. .......................... 219/543; 219/209; 174/250; 338/314
[58] Field of Search .................... 219/543, 209; 174/250, 251, 252, 261; 338/308, 314, 48, 49, 239, 260, 319, 320

[56] References Cited

U.S. PATENT DOCUMENTS

| | | | |
|---|---|---|---|
| 2,521,540 | 9/1950 | Richardson | 219/19 |
| 2,641,675 | 9/1953 | Hannahs . | |
| 3,584,189 | 6/1971 | Marcoux | 219/209 |
| 4,093,355 | 6/1978 | Kaplit et al. | 350/334 |
| 4,103,144 | 7/1978 | Pizzarello et al. | 219/209 |
| 4,374,316 | 2/1983 | Inamori et al. | 219/209 |
| 4,410,874 | 10/1983 | Scapple et al. | 338/307 |
| 4,481,403 | 11/1984 | Del Monte | 219/209 |
| 4,574,186 | 3/1986 | Sakai et al. . | |
| 4,654,624 | 3/1987 | Haganet | 338/34 |
| 4,743,740 | 5/1988 | Adee . | |
| 5,010,233 | 4/1991 | Henschen et al. | 219/209 |
| 5,177,341 | 1/1993 | Balderson . | |
| 5,181,006 | 1/1993 | Shafe et al. . | |
| 5,182,431 | 1/1993 | Koontz et al. | 219/203 |
| 5,268,558 | 12/1993 | Youssef et al. | 219/209 |
| 5,408,574 | 4/1995 | Deevi et al. | 392/404 |
| 5,475,204 | 12/1995 | Giamati et al. . | |
| 5,657,532 | 8/1997 | Alexander et al. | 29/611 |

*Primary Examiner*—John A. Jeffery
*Assistant Examiner*—Daniel L. Robinson
*Attorney, Agent, or Firm*—Alston & Bird LLP

[57] ABSTRACT

A multilayer circuit board and an associated heating apparatus is provided for heating electrical components. The multilayer circuit board includes a trace layer having at least one electrical trace terminating with a contact pad that is positioned to electrically contact a respective lead of an electrical component mounted upon the multilayer circuit board. The multilayer circuit board also includes a heating layer disposed in thermal contact with the electrical component mounted upon the multilayer circuit board. The heating layer includes a first electrically resistive heating element disposed upon an insulating substrate in general alignment with the electrical component mounted upon the multilayer circuit board. The electrically resistive heating element provides heat to maintain the operating temperature of the electrical component within a desired range. By increasing the operating temperature of the electrical component, the multilayer circuit board allows less expensive, commercial grade electronics to be utilized which would otherwise have been susceptible to failure at lower temperatures.

21 Claims, 7 Drawing Sheets

MULTILAYER CIRCUIT BOARD WITH ELECTRICALLY RESISTIVE HEATING ELEMENT

RELATED APPLICATIONS

This application claims priority from U.S. Provisional Patent Application Serial No. 60/027,619 entitled "Fractal Heater" which was filed on Oct. 4, 1996, the contents of which are incorporated in their entirety herein.

FEDERALLY SPONSORED RESEARCH OR DEVELOPMENT

This invention was made with government support under DAAK 60-95-C-2029 awarded by the Department of Defense and the Army. The government has certain rights in this invention.

FIELD OF THE INVENTION

The present invention relates to an electrical resistance heater and, more particularly, to an electrical resistance heater which produces a uniform heat field for maintaining electrical components mounted upon a circuit board at a suitable operating temperature.

BACKGROUND OF THE INVENTION

Prior to the introduction of solid state electronics, the operating temperature of electronic devices was not of much consequence. This was mainly because electronic parts such as capacitors, inductors and resistors were made of metallic materials such as copper or silver. These metallic materials did not experience unacceptable conductive property changes over wide temperature ranges. Thus, the electrical components could be exposed to a wide range of temperature environments without concerns of changes in the components' performance.

With the advent of solid state devices, however, device operating temperatures became a concern. The advantage of solid state devices is that their conductivity ranges between the conductivity of metals and insulators. In practice, the conductivity of a solid state device such as silicon is modifiable by doping the silicon with impurities, thereby changing the devices characteristics to a desired conductivity. The problem, however, is that the conductivity of solid state devices is also changed due to device operating temperature. For this reason, many electronic devices on the market today will only operate with the desired characteristics within certain temperature ranges. Although many electronic applications operate within these acceptable ranges, concerns are raised when operating temperatures are at either the lowest or highest limits of these ranges.

For many years, designers have placed emphasis on heat dissipation. Many electronic applications operate in either room temperature or higher temperature environments and thus require techniques for heat removal to keep the electrical components at acceptable operating temperatures. In fact, heat dissipation has become an extremely important concern in the area of electronic assembly miniaturization. In these applications, the close, physical proximity of electronic devices produces heat dissipation problems which must be remedied. To combat these heating problems, the industry has created many techniques such as the use of heat sinks and micro-electromechanical devices (i.e., fans and pumps) to facilitate heat removal.

Although there has been many strides in effective heat removal for electronic devices at room temperature or higher temperature ranges, very little has been done in the industry to heat devices which operate in lower temperature ranges. However, there is a need for such techniques. For example, electronics used in aircraft and space applications are subjected to extremely cold temperatures associated with the upper atmosphere and space. Further, electronics are also used in deep oceanography (i.e., submarines) and in arctic conditions. Finally, electronics are utilized in everyday refrigeration and air cooling units and also in winter specific applications. These applications operate at low temperatures which may cause the electrical components to either fail or operate in an undesirable manner.

In the past, designers who are faced with applications that will be subjected to lower temperatures have used specifically designed electrical components which operate with desired properties at lower temperatures. These devices are quite expensive and sometimes do not operate with desired characteristics in extremely cold temperature conditions. Because of the expense and unreliability of these specifically designed electrical components, there is a need for heating techniques which would allow the use of common commercial electronic devices.

The aircraft and aerospace industry are accustomed to dealing with the problems occasioned by low temperature affects on air and space craft equipment. For instance, many techniques have been developed to combat icing on wings and engine parts during flights. In particular, U.S. Pat. No. 4,743,740, to Adee and U.S. Pat. No. 5,475,204 to Giamati et al. provide techniques for heating the wing and engine areas on airplanes. These techniques utilize metallic, resistive elements which are connected to a power source so as to produce thermal energy as current is passed therethrough.

Although these techniques provide heat in low temperature applications, these techniques would be difficult, if not impossible, to apply to the heating of electrical components. For instance, these heating devices are embedded into parts where there is little concern for size of the conductors. In contrast, however, overall structural size is a major concern in the electronics industry. Second, these heating techniques tend to produce non-uniform heating as disclosed in '204 to Giamati et al. Non-uniform heating may cause particular problems for electrical components because some portions of the component will be operating at a satisfactory temperature while other portions are not.

Finally, these prior techniques do not address the problems with electronic noise generated by most heater designs. In fact, these heating devices often include straight parallel conductors which may produce undesirable electronic interference. For example, electromagnetic or magnetoelectric energy generated by one or more electrical components constitutes electronic noise which may couple to the straight parallel conductors of the heater through ordinary magnetoinductive or radiant energy coupling phenomena. This noise can propagate through the heating device and, in turn, reverse couple into other electrical components, thereby causing undesired electronic interference.

At least one company currently produces a heating element specifically designed for the heating of electrical components. The Minco Company of Minneapolis, Minn. manufactures a Thermofoil brand heating device. This heater is composed of electrical heater strips that employ wide traces of alloyed, electrically conductive materials plated upon an electrically insulated substrate, such as Mylar, to form a electrically resistive heating element. Unfortunately, these Thermofoil heating devices also suffer from several deficiencies. For instance, these Thermofoil heaters include parallel traces which do not provide for uniform heating. Second, the parallel traces also can cause electronic interferences as previously discussed. Third, these heaters are usually attached to the top of electrical components, opposite the circuit board to which the electrical component is mounted. This configuration is inefficient because some of the heat is dissipated to the air while the heat supplied to the electrical component must penetrate the casing of the electrical component. Finally, Thermofoil heaters are expensive to produce, costing about thirty dollars per unit. This cost may sometimes exceed the cost of specifically electrical components designed for colder temperatures, thereby making the heater not cost effective.

For the foregoing reasons, there exists a need for a heating device which provides uniform heating of electrical components, without producing significant electronic noise, at a reasonable cost.

SUMMARY OF THE INVENTION

As set forth below, the heating apparatus of one embodiment of the present invention as well as a multilayer circuit board that includes a heating layer according to another embodiment of the present invention overcomes the deficiencies identified with the conventional techniques. In particular, the heating apparatus and associated multilayer circuit board of the present invention uniformly heats electrical components, such as electrical components mounted upon the circuit board, in a controlled fashion and at a reasonable cost such that the temperature of the electrical components is maintained at a desired operating temperature. By maintaining the temperature of the electrical components at the desired operating temperature, the heating apparatus and associated multilayer circuit board permits less expensive, commercial electrical components to be utilized for most applications.

These and other advantages are provided, according to the present invention, by a multilayer circuit board and an associated heating apparatus for heating electrical components, such as electrical components mounted upon the circuit board. The multilayer circuit board includes a trace layer having at least one electrical trace terminating with a contact pad that is positioned to electrically contact a respective lead of an electrical component mounted upon the multilayer circuit board. The multilayer circuit board also includes a heating layer disposed in thermal contact with the electrical component mounted upon the multilayer circuit board. The heating layer includes a first electrically resistive heating element disposed upon an electrically insulating substrate such that the electrically resistive heating element is in general alignment with the electrical component mounted upon the multilayer circuit board. In this embodiment, the electrically resistive heating element provides heat to maintain the operating temperature of the electrical component above a predetermined minimum temperature, such as 0° C. By maintaining the operating temperature of the electrical component above the predetermined minimum temperature, less expensive, commercial grade electrical components can be utilized which would have been susceptible to failure at lower temperatures.

In one advantageous embodiment of the present invention, the electrically resistive heating element includes an element body extending between and electrically connecting first and second opposed ends. In turn, the first and second opposed ends for can be electrically connected to a power source. By passing current through the element body of the electrically resistive heating element, the electrically resistive heating element produces heat which is thermally conducted, at least in part, to the electrical components, thereby increasing the operating temperature of the electrical components.

In one embodiment of the present invention, the electrically resistive heating element defines a pattern within a predetermined area of the electrically insulating substrate. In this embodiment, the electrically resistive heating element is placed in general alignment with the electrical component mounted upon the multilayer circuit board such that the heat emitted by the electrically resistive heating element is distributed to the electrical component. By generally aligning the electrically resistive heating element with a particular electrical component, the heat generated by the heating element is efficiently provided to the electrical component without unnecessarily heating other electrical components.

In order to uniformly heat an electrical component, the pattern defined by the heating element preferably accurately replicates the shape and size of the respective electrical component. Since the electrically resistive heating element is an electrical trace or wire, the pattern defined by the heating element must also be constructed so as to not intersect itself. Finally, in order to provide uniform heating, the electrically resistive traces defining the heating element are preferably closely spaced together such that the areas between the traces of the pattern are properly heated.

Advantageously, the electrically resistive heating element of one embodiment defines a pattern which includes at least one fractal curve, such as a rectilinear Hilbert fractal curve. A fractal curve is a space filling curve which is repeated in ever smaller scales to produce irregular shapes and surfaces. The use of these fractal curves permits the electrically resistive heating element to substantially fill and uniformly heat a predetermined area, such as the area underlying an electrical component.

In order to accommodate variations in the ambient temperature surrounding the electrical component, the heating element of the present invention can be configured and/or powered in several different manners in order to provide varying amounts of heat to the electrical component in order to maintain the electrical component above a predetermined minimum temperature. In one embodiment, the electrically resistive heating element is connected to a variable power supply such that different amounts of heat can be produced by the heating element in proportion to the power supplied to the electrically resistive heating element.

In another embodiment, the multilayer circuit board of the present invention includes a second electrically resistive heating element disposed on the electrically insulating substrate. In this embodiment, the first and second electrically resistive heating elements can be connected to first and second power sources by first and second switches, respectively. By appropriately configuring the switches, the heating layer of this embodiment can provide several different levels of heating. For example, by opening the first switch and closing the second switch, the electrical component is heated solely by the second electrically resistive heating element. Likewise, by closing the first switch and opening the second switch, the electrical component is heated solely by the first electrically resistive heating element. In addition to closing the switches one at a time, both the first and second switches can be closed at the same time such that both the first and second electrically resistive heating elements provide heat to the electrical component. Still further, the first and second electrically resistive heating elements can be connected in series and supplied power from one power source, if so desired.

Although the heating apparatus of the present invention has been heretofore described as a heating layer embedded within a multilayer circuit board, a heating apparatus is also provided that is not an integral layer of a multilayer circuit board, but which still heats an electrical component. In this embodiment, the heating apparatus includes an electrically insulating substrate that is mounted in thermal contact with an electrical component. The heating apparatus also includes an electrically resistive heating element disposed upon the insulating substrate. As described above, the element body of the electrically resistive heating element defines a pattern within a predetermined area of the electrically insulating substrate that preferably includes at least one fractal curve in order to provide uniform and efficient heating of the electrical component.

In certain applications, such as extremely low temperature applications, the heating apparatus is preferably in even closer physical proximity to the electrical component. In this embodiment, the electrically insulating substrate supports not only the heating element, but also at least one electrical trace that terminates with a contact pad. As before, an electrical component is mounted upon the substrate such that at least one electrical lead of the electrical component contacts the contact pad. According to this embodiment, the electrically resistive heating element is preferably disposed upon the electrically insulating substrate so as to underlie and be in general alignment with the electrical component, thereby permitting the electrical component to be heated in a direct manner.

Accordingly, the heating apparatus and associated multilayer circuit board of the present invention heats electrical components, such as the electrical components mounted upon the multilayer circuit board, in an efficient and uniform manner. As such, the temperature of the electrical components can be maintained above a predetermined minimum operating temperature, such as 0° C., such that the electrical components will continue to operate in low temperature environments.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
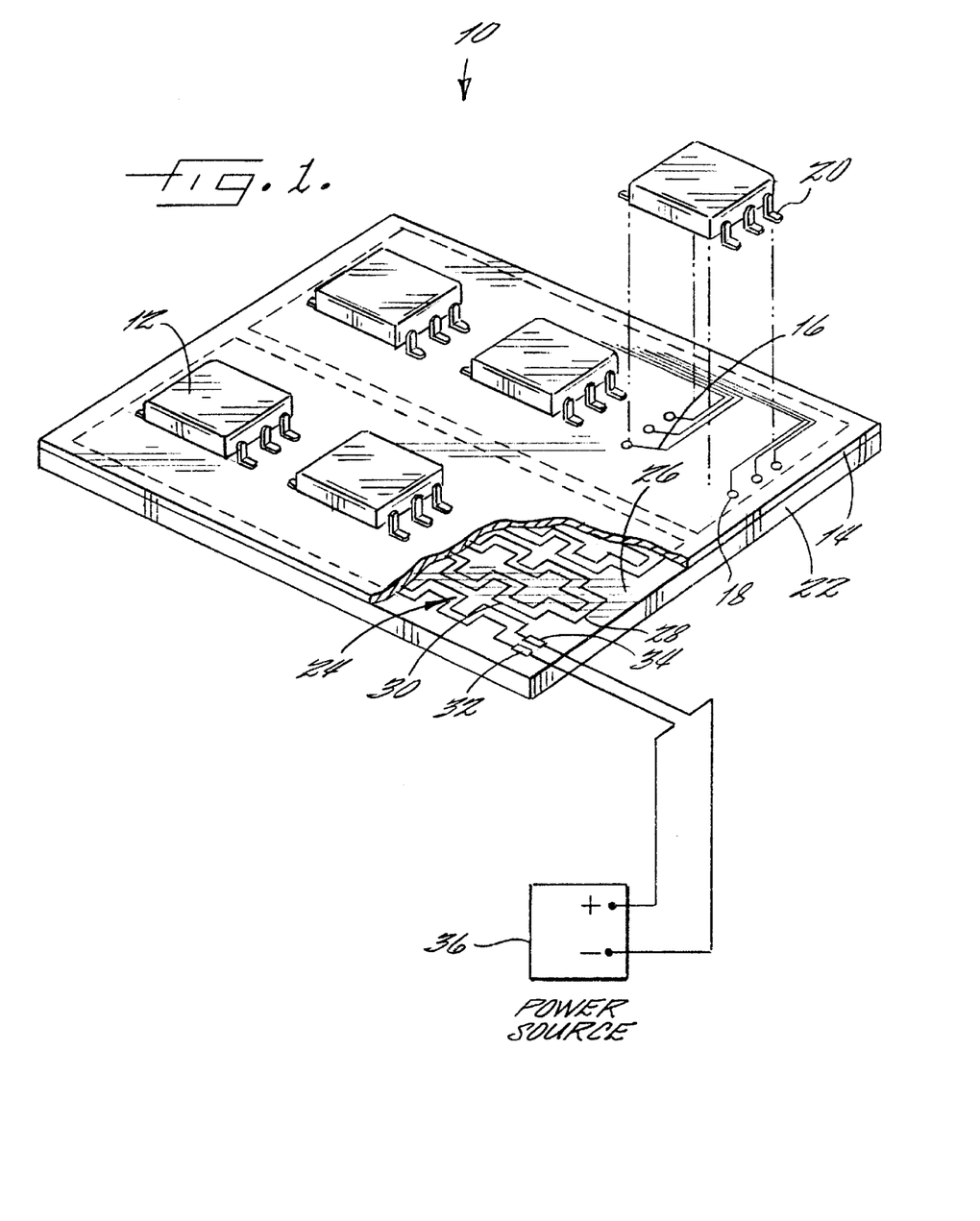
FIG. 1 is an exploded perspective view of a multilayer circuit board according to one embodiment of the present invention.

The multilayer circuit board 10 of the present invention provides heat to an electrical component 12 such that the temperature of the electrical component 12 is maintained within a desired operating temperature. As illustrated in FIG. 1, the multilayer circuit board 10 includes a trace layer 14 having at least one and, more typically, a plurality of electrical traces 16 disposed upon an electrically insulating substrate, typically formed of a dielectric material, such as fiberglass. A number of the electrical traces terminate with respective contact pads 18 that are positioned to electrically contact respective leads 20 of an electrical component 12 mounted upon the multilayer circuit board 10. As such, the contact pads generally define the "footprint" of the electrical component upon the circuit board. As known to those skilled in the art, the trace layer provides for the electrical interconnection of the electrical components mounted upon the circuit board.

Although the preferred embodiment illustrates a printed circuit board, the multilayer circuit board may also be an advanced printed circuit board such as a multilayer high density laminate interconnect structure or, alternatively, an etched circuit board. Further, the electrical traces and contact pads of the present invention may consist of any electrically conductive material such as copper, gold or aluminum, for example.

The multilayer circuit board 10 also includes a heating layer 22 disposed in thermal contact with the trace layer 14 and, in turn, with the electrical component 12 mounted upon the circuit board. The heating layer 22 includes a first electrically resistive heating element 24 disposed upon an electrically insulating substrate 26, typically formed of a dielectric material such as fiberglass. In order to effectively heat the electrical component, the electrically resistive heating element 24 is in general alignment with the electrical component 12 mounted upon the multilayer circuit board 10 so as to heat the electrical component during exposure to low temperature conditions in order to maintain the operating temperature of the electrical component within a predefined operating range, typically above 0° C. For a circuit board having a number of horizontal layers, the electrically resistive heating element of the heating layer is preferably aligned vertically with a corresponding electrical component mounted upon the trace layer.

The electrically resistive heating element 24 of the present invention may be disposed on the electrically insulating substrate 26 by any technique known to those skilled in the art. For example, the electrically resistive heating element may be laminated to the electrically insulating substrate, or etched into the electrically insulating substrate using known etching procedures, or by inking a electrically resistive polymer liquid on the electrically insulating substrate. Further, the electrically resistive heating element may be formed of traces of any desirable electrically resistive material including copper, gold, aluminum, or conductive polymer.

As shown in FIG. 1, one preferred embodiment of the electrically resistive heating element includes an element body 30 extending between and electrically connecting first 32 and second 34 opposed ends of the heating element. In this embodiment, the first 32 and second 34 opposed ends are electrically connected to a power source 36. Although the preferred embodiment illustrates the power source as being a voltage supply, such as a battery, it is understood that the power source 36 may be any type of power supply (i.e., current or voltage). Further, the power source 36 may be a variable power source such that the power supplied to the electrically resistive heating element may be varied. In this further embodiment, the variation of the power source 36 controls the power supplied to the electrically resistive heating element 24, thereby controlling the current flowing through the electrically resistive heating element and the resulting heat generated by the heating element. In either embodiment, the power source causes current to flow along the element body of the electrically resistive heating element. As known to those skilled in the art, the resistance of the element body consumes a portion of the power which is generally converted into heat for heating a corresponding electrical component according to the present invention. Typically, the power consumed by the resistance of the element body and converted into heat is equal to the square of the voltage supplied by the power source divided by the resistance of the electrically resistive heating element, i.e., $V^2/R$.

As stated previously, one advantage of the present invention is the uniform heating of the electrical components. Uniform heating of electrical components is accomplished by using electrically resistive heating elements which define a predefined pattern. The patterns defined by the heating elements serve a dual purpose in the uniform heating of electrical components. First, the pattern defined by a heating element is placed in general alignment with a respective electrical component such that heat is efficiently delivered to the electrical component. Second, the pattern defined by a heating element is preferably configured such that the pattern substantially approximates the size and shape of the electrical component. As such, the pattern defined by a heating element preferably substantially fills the footprint of the respective electrical component. In addition, the sinuous pattern defined by the electrical trace which forms the element body preferably includes trace segments that are closely spaced together such that all of the electrical component is adequately heated, as described in detail hereinbelow.

Circuit boards and electrical components are configured in many different shapes and sizes. To provide adequate heating for these differently shaped and sized electrical components, the electrically resistive heating element 24 of the present invention provides an element body 30 which preferably defines a pattern 28 within a predetermined area of the heating layer 22 which closely approximates the shape and size of the electrical component 12. As described above, this pattern is in general alignment with the corresponding electrical component 12 mounted upon the trace layer 14. This pattern 28 can consist of any preferred shape and can be configured to provide heat to the entire multilayer circuit board, or to only certain areas of the multilayer circuit board upon which selected electrical components are mounted.

Figure 2:
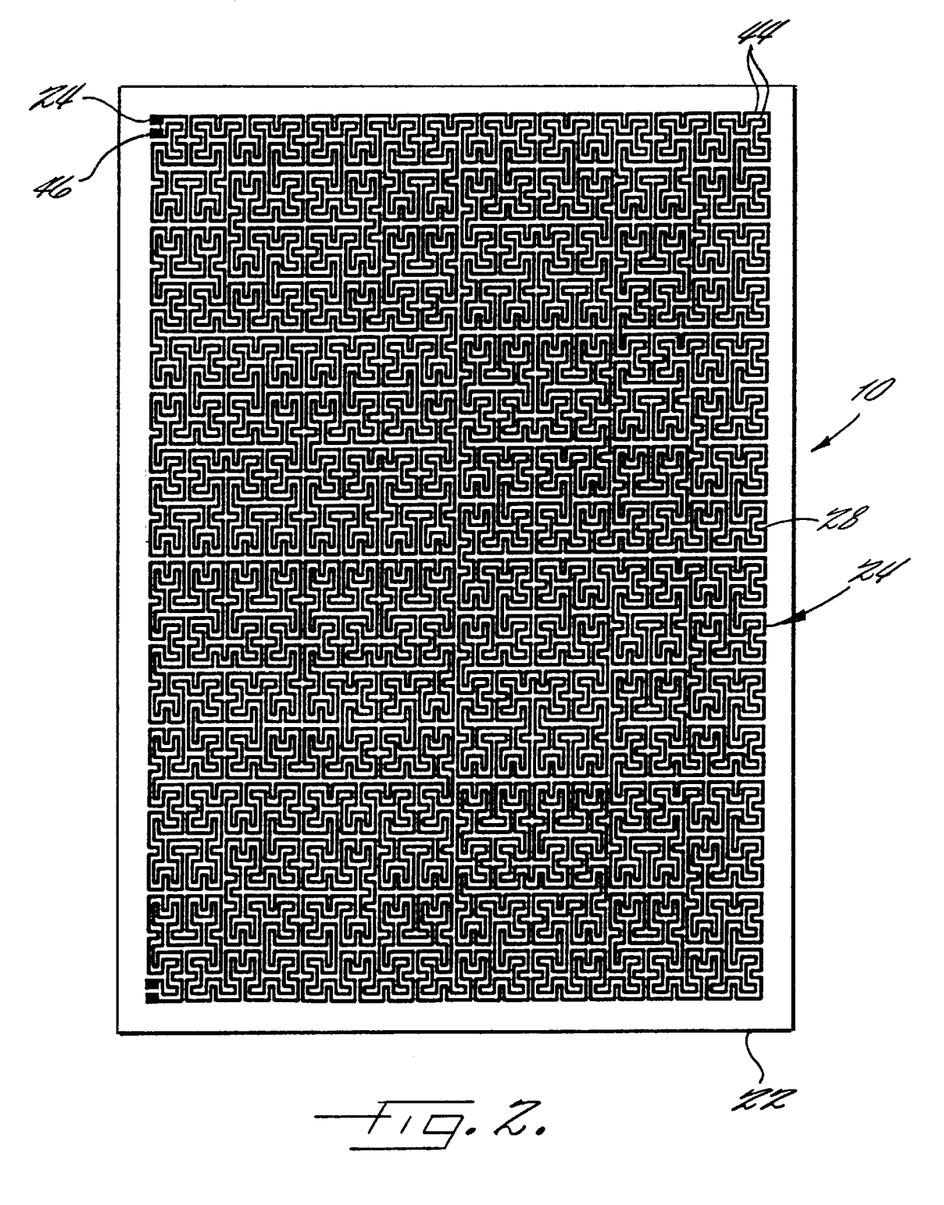
FIG. 2 is a plan view of the first and second intertwined resistive heating elements of the multilayer circuit board of FIG. 1.

For instance, FIG. 2 illustrates one embodiment of the present invention in which the pattern 28 defined by the electrically resistive heating element 24 is rectangular. In this embodiment, the electrically resistive heating element 24 may be either reduced in size such as to only heat one electrical component or it may be enlarged to provide heat to the entire multilayer circuit board 10.

Figure 3:
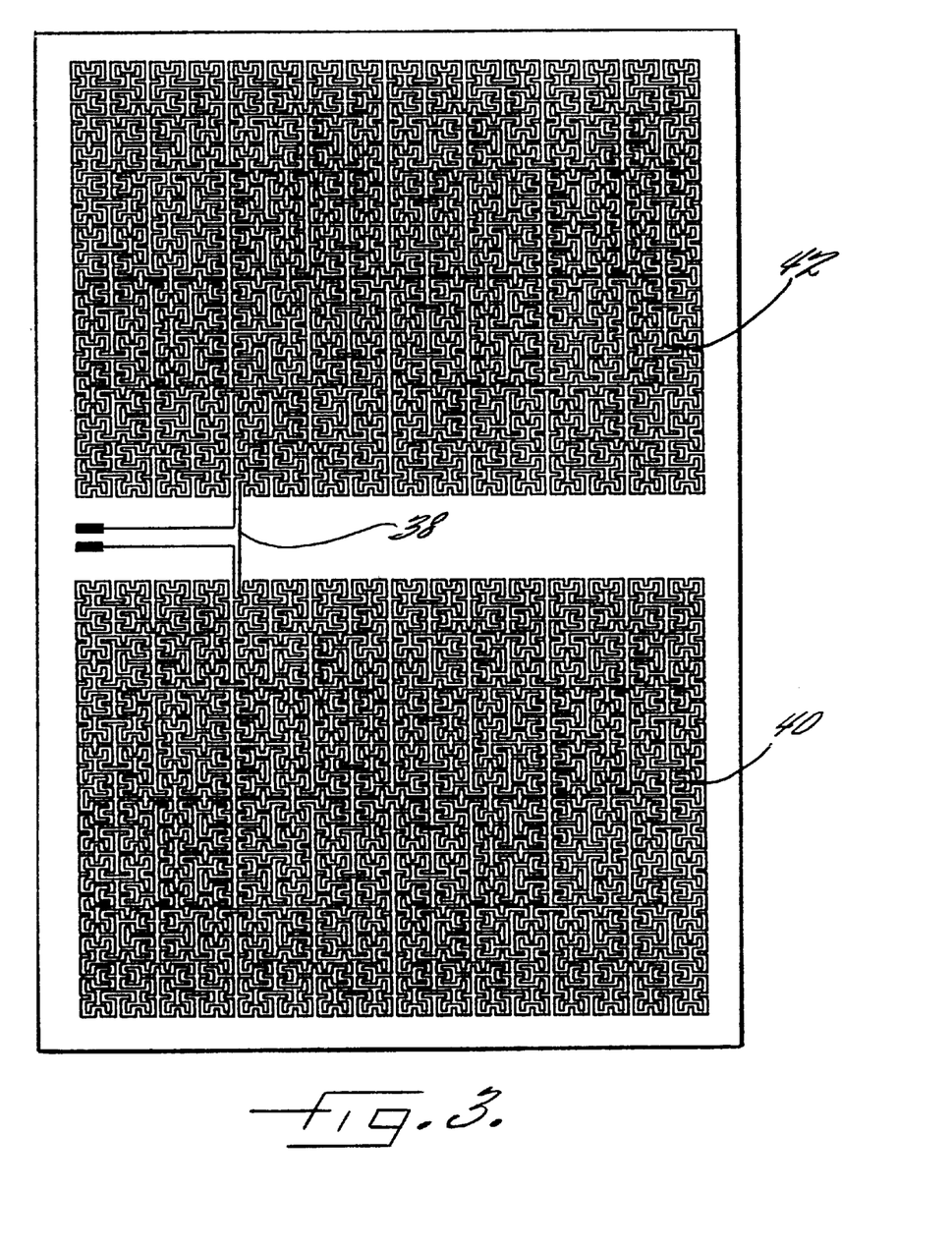
FIG. 3 is a plan view of one advantageous embodiment of the electrically resistive heating element of FIG. 2.

In some applications, it is advantageous to provide heat to only certain areas of the multilayer circuit board 10. Thus, as illustrated in FIG. 3, the heating element of one embodiment of the present invention defines a pattern which allows the heating of only predetermined areas of the multilayer circuit board 10 while not heating other areas of the multilayer circuit board, i.e., areas on which no electrical components are mounted. In this embodiment, the electrically resistive heating element 24 defines two distinct patterns 40 and 42 connected by a connecting trace 38. Other than the connecting trace, however, the two patterns defined by the heating element are physically separated by a zone in which relatively little, if any, heating is provided. Thus, the electrically resistive heating element 24 of this embodiment is one continuous electrically resistive trace which heats two separate areas of the multilayer circuit board 10.

As stated earlier, the pattern defined by the electrically resistive heating element also promotes uniform heating of an electrical component by substantially approximating the size and shape of the electrical component and by defining traces that are closely spaced together. To produce uniform heat, the pattern defined by the electrically resistive heating element 24 is preferably formed to provide substantially uniform heat to the entire area of the electrical component 12 with which the heating element is aligned. More specifically, the pattern defined by the heating element preferably approximates both the size and shape of the electrical component 12. In addition, the pattern defined by the heating element preferably includes electrically resistive traces that are closely spaced together such that those portions of the electrical component aligned with the area between the traces are adequately heated. Further, the pattern defined by the heating element must constitute a continuous electrically resistive trace which does not intersect itself at any point.

The above requirements are satisfied by one embodiment of the present invention which includes an electrically resistive heating element 24 having an element body 30 defining a pattern 28 which includes at least one space filling curve. Space filling curves are a group of curves that, when connected, will substantially fill a predetermined area. There are many types and combinations of space filling curves which can be used to generate the pattern of the present invention. However, for representation purposes only, the pattern defined by the heating element of a preferred embodiment includes fractal curves. The electrically resistive heating element of the present invention advantageously defines a pattern that includes one or more fractal curves since fractal curves can be combined to form patterns having irregular shapes and sizes. As such, an electrically resistive heating element that defines a pattern including one or more fractal curves permits the pattern to closely approximate the size and shape of the electrical component regardless of the shape of the component.

As stated above, the heating element preferably includes electrical traces that are both continuous and closely spaced such that the area between the electrically resistive traces are adequately heated. Therefore, in one embodiment of the present invention, the pattern 28 defined by the element body 30 of the electrically resistive heating element 24 includes at least one self-avoiding rectilinear Hilbert fractal curve.

Hilbert fractal curves are well known, see HEINZ-OTTO PEITGEN, CHAOS AND FRACTALS: NEW FRONTIERS OF SCIENCE (1992); FRACTALS FOR THE CLASSROOM (1992). However, to facilitate a full understanding of the present invention, the formation of a Hilbert fractal curve is more fully described herein. A Hilbert fractal curve is composed of two basic elemental curves. These curves are connected together in different orientations to create a larger curve. By iteratively constructing successively larger curves as shown in FIGS. 4A–4F, a Hilbert fractal curve is formed which approximately fills an area with closely aligned traces that are self-avoiding.

Figure 4A:
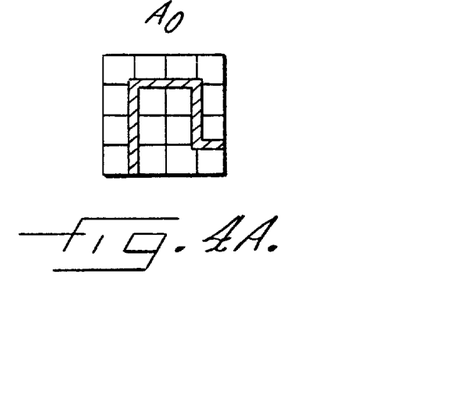
FIGS. 4A–4F are illustrative patterns for the construction of a rectilinear Hilbert fractal curve according to one embodiment of the present invention.
Figure 4B:
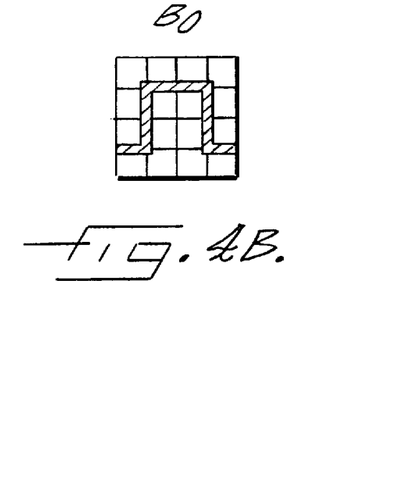

The Hilbert fractal curve is generated by the use of two rectilinear patterns which are called $A_x$ and $B_x$. A first iteration of these two rectilinear patterns are shown in FIGS. 4A and 4B and are labeled $A_0$ and $B_0$. As described below, these two patterns are used to iteratively synthesize larger, more complex versions of the two basic patterns. The iterative process is continued until any desired size is produced.

The iterative process involves replicating and thereafter orienting the two basic patterns to form the next iteration of the Hilbert fractal curve. As an aid to understanding the steps of this iteration, the following description is provided:

$A_{i+1}=$
 Upper left: $A_i$;
 Upper right: Flip horizontal $(A_i)$;
 Lower right: Rotate left $(A_i)$;
 Lower left: Rotate right $(B_i)$.

$B_{i+1}=$
 Upper left: $A_i$;
 Upper right: Flip horizontal $(A_i)$;
 Lower right: Rotate left $(A_i)$;
 Lower left: Flip vertical (rotate right $(A_i)$).

Figure 4C:
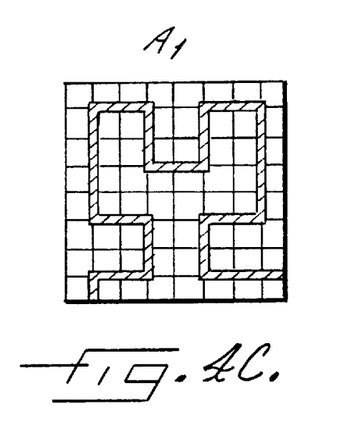

With reference to the above description and to FIG. 4C, the iterative construction of $A_1$ is described. In step (1), the pattern $A_0$ of FIG. 4A is placed in the upper left quadrant of the grid as shown in FIG. 4C. In step (2), the upper right quadrant is filled with the $A_0$ pattern which has been rotated about its vertical axis, i.e., flipped horizontally. In step (3), the lower left quadrant is filled with the $A_0$ pattern which has been rotated counterclockwise 90 degrees, i.e., rotated left. Finally, in step (4), the $B_0$ pattern is rotated clockwise 90 degrees, i.e., rotated right, and placed in the lower left quadrant to complete the $A_1$ pattern. The $B_1$ pattern must now be constructed as described above prior to constructing the next iteration of the A pattern, i.e., the $A_2$ pattern shown in FIG. 4E.

Figure 4D:
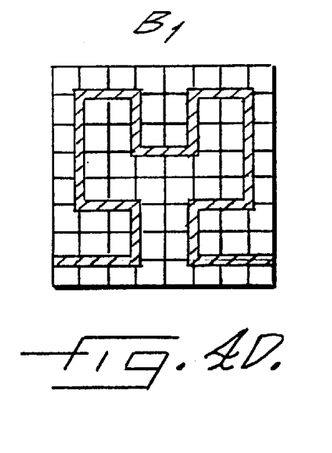

With reference to the above description and FIG. 4D, the iterative construction of $B_1$ is described. In step (1), the pattern $A_0$ of FIG. 4A is placed in the upper left quadrant as shown in FIG. 4D. In step (2), the upper right quadrant is filled with an $A_0$ pattern which has been rotated about its vertical axis, i.e., flipped horizontally. In step (3), the lower left quadrant is filled with an $A_0$ pattern which has been rotated counterclockwise 90 degrees, i.e., rotated left. Finally, in step (4), the $A_0$ pattern is rotated clockwise 90 degrees prior to being flipped about its horizontal axis in order to fill the lower left quadrant, thereby completing the iterative construction of $B_1$.

Figure 4E:
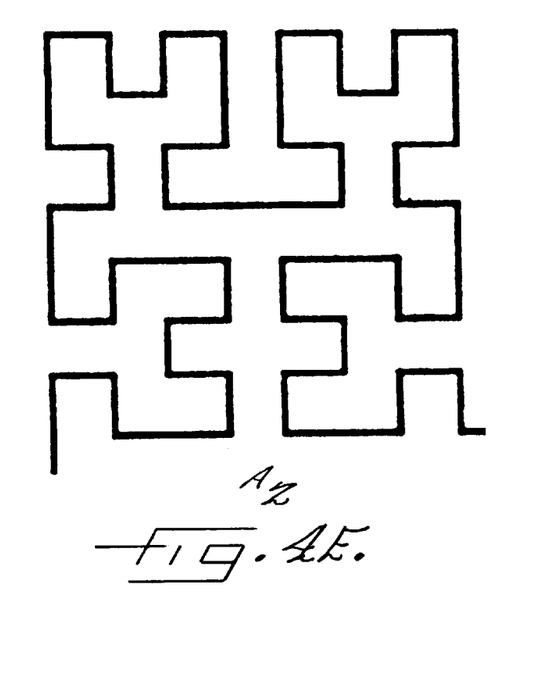
Figure 4F:
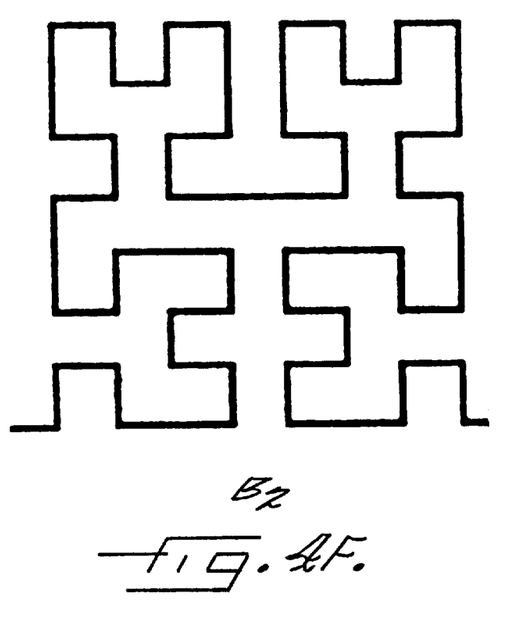

FIGS. 4E and 4F illustrate the construction of the $A_2$ and $B_2$ patterns. In this iteration, the above steps are repeated except that the patterns $A_1$ and $B_1$ that were created in the first iteration are used in place of $A_0$ and $B_0$. To create a pattern as shown in FIGS. 2 or 3, the iterations would be continued until the predetermined area is filled by the Hilbert fractal curve. In addition, by appropriately sizing the grid on which the pattern is formed, the resolution of the resulting Hilbert fractal curve can be tailored to meet the requirements of a variety of applications.

In electronic applications, the introduction of electrical noise can hinder the performance of the electrical components. As known to those skilled in the art, electronic noise can be exacerbated by straight parallel conductors. As such, heating elements which utilize long lengths of straight parallel electrical traces are preferably avoided. Thus, the electrically resistive traces 44 which form the element body 26 of the electrically resistive heating element 24 preferably do not extend in parallel for any substantial length.

As stated previously, it is advantageous to increase the temperature of the electrical component to a desired operating temperature. However, the ambient temperature of the environment in which the electronic component resides may vary. Thus, the heating element is preferably able to provide variable amounts of heat to the electrical component. Referring to FIG. 1, the present invention includes several embodiments which can provide different amounts of heat. In one preferred embodiment, the electrically resistive heating element 24 is connected to a variable power supply such that the heat provided to the electrical component 14 from the heating element 24 is in proportion to the power supplied by the power source 36.

Figure 5A:
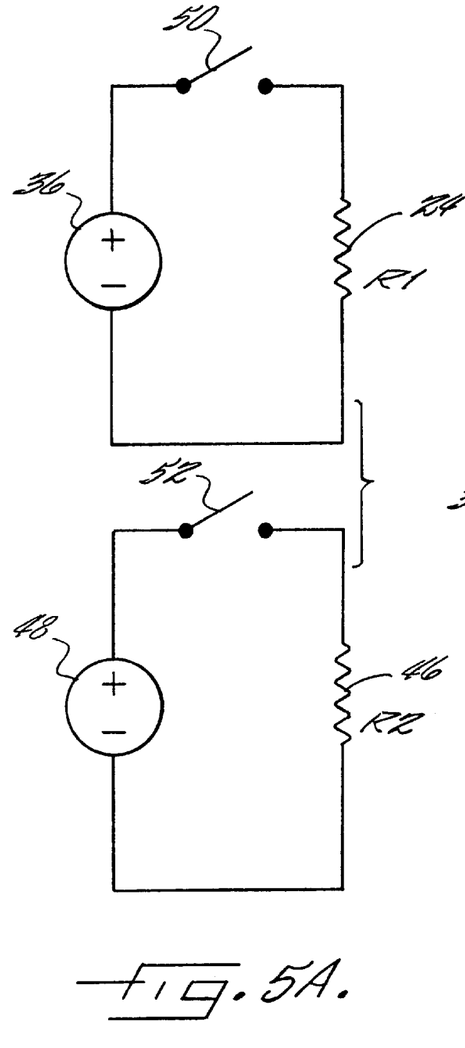
FIGS. 5A–5B are schematic views of the electrical connection of the electrically resistive heating element of the present invention to a power source.

Referring now to FIG. 2, the multilayer circuit board 10 of another embodiment of the present invention includes, not only a first electrically resistive heating element connected to a first power supply, but also a second electrically resistive heating element 46 disposed on the same electrically insulating substrate 22. In this embodiment, the second electrically resistive heating element 46 is connected to a second power source 48, as shown schematically in FIG. 5A. In this embodiment, both the first 24 and second 46 electrically resistive heating elements can be connected to first 36 and second 48 power sources by first 50 and second 52 switches, respectively. In this embodiment, the switches, 50 and 52, can be configured such that several different amounts of heat can be applied to the multilayer circuit board 10. For example, in one embodiment, switch one 50 is open and switch two 52 is closed such that the electrical component 14 is only heated by the first electrically resistive heating element 24. In a further embodiment, switch one 50 is open and switch two 52 is closed such that the electrical component is heated with only the second electrically resistive heating element. By controlling the physical dimensions of the traces which form the respective heating elements, the shape and size of the patterns defined by the heating elements and the material which form the respective heating elements, the first and second electrically resistive heating elements can be tailored to provide different amounts of heat to the electrical components mounted upon the circuit board.

Although the above-described figures illustrate that the first and second electrically resistive heating element patterns are intertwined, it is understood that the two heating elements may take any form and may be in any configuration. Further, it may be advantageous for the first and electrically resistive heating elements to be disposed on different insulating substrates. Also, it must be understood that switches 50 and 52 may be any type of switches, including manual, solenoid, or electronic switches, i.e., junction field effect transistors (JFETs) or metal-oxide semiconductor field effect transistors (MOSFETs).

Figure 5B:
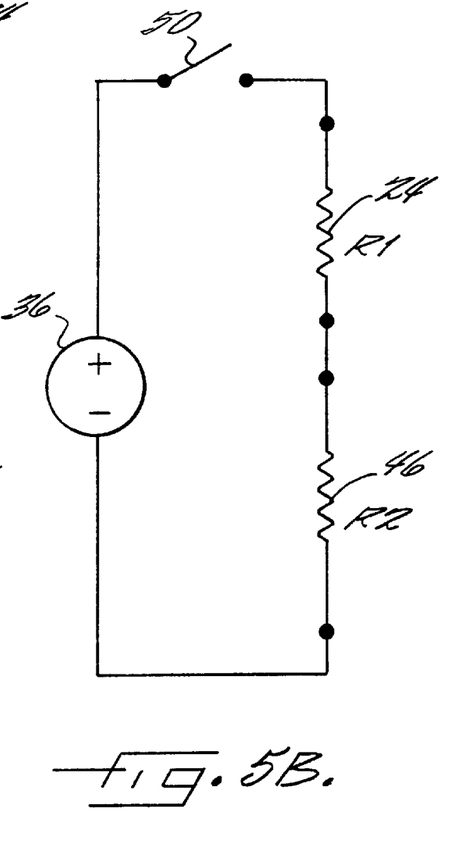

In a further embodiment, both switch one 50 and switch two 52 are closed, thereby supplying power to both the first 24 and second 46 electrically resistive heating elements. In this embodiment in which the first and second electrically resistive heating elements establish separate circuits, the heat provided to the electrical component 14 is increased relative to the heat generated by either of the heating elements alone since the heat is equal to the sum of the heat provided by both the first 24 and second 46 electrically resistive heating elements. Now referring to FIG. 5B, the first 24 and second 46 electrically resistive heating elements of another embodiment can be connected in series and can be supplied power from a single power source 36, if so desired. In this configuration, the heat generated is by the first and second heating elements (designated R1 and R2, respectively) is equal to the square of the voltage supplied by the power source divided by the sum of the electrically resistive heating elements, i.e., $V^2/(R1+R2)$.

Although the above preferred embodiments illustrate two heating elements, it is understood that the heating layer can include any number of electrically resistive heating elements that may be interconnected in a variety of configurations as described above. In these further embodiments, the different switch configurations generally allow for different levels of heating and/or larger ranges of heating.

In some preferred applications, it is advantageous to provide an apparatus for heating an electrical component wherein the heating apparatus is not an integral layer of a multilayer circuit board. In this embodiment, the apparatus comprises an electrically insulating substrate 22 and an electrically resistive heating element 24 disposed upon the substrate, typically in a pattern that includes a fractal curve, as described above in conjunction with a multilayer circuit board, see FIG. 2. Although not an integral layer of a multilayer circuit board, the heating apparatus of this embodiment is preferably mounted in thermal contact with an electrical component 14. For example, the heating apparatus of this embodiment may be sandwiched between the electrical component and a multilayer circuit board, if so desired. Alternatively, the heating apparatus of this embodiment can be mounted to the top, side or other surface of an electrical component in order to more efficiently heat the electrical component. Moreover, the heating apparatus of this embodiment can also be mounted in thermal contact with other objects and is not limited to applications involving the heating of an electronic component.

In extremely low temperature environments, it may be advantageous to provide a heating apparatus in close physical proximity to the electrical component so as to permit direct conduction of heat to the component without the heat loss associated with passing through intermediate layers, such as those layers of a multilayer circuit board disposed between the heating layer and the trace layer. Further, by placing the heating apparatus in close physical proximity to an electrical component, the particular electrical component can be heated without significantly affecting the temperature of surrounding components. Thus, the heating apparatus of one advantageous embodiment provides for the heating of electrical components that are disposed in close physical proximity.

Figure 6:
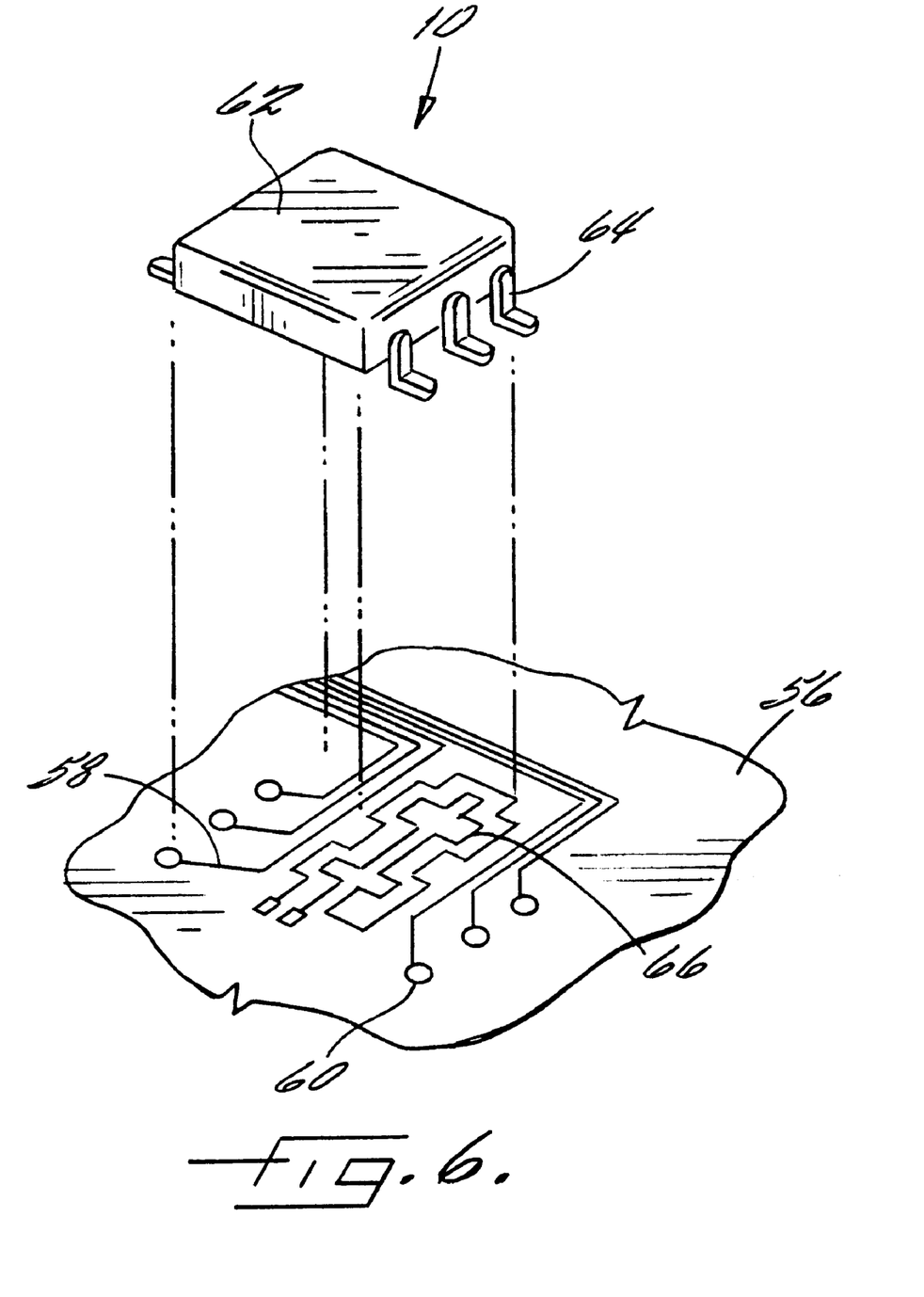
FIG. 6 is a perspective view of an electrically resistive heating element disposed upon an electrically insulating substrate, wherein the electrically resistive heating element underlies and is in general alignment with the electrical component.

The heating apparatus of this embodiment includes an electrically insulating substrate 56 having at least one electrical trace terminating 58 with a contact pad 60, see FIG. 6. Mounted upon the electrically insulating substrate 56 is an electrical component 62 which has at least one electrical lead 64 positioned to electrically contact the contact pad 60. Further, the apparatus includes an electrically resistive heating element 66 which is disposed upon the electrically insulating substrate 56 and positioned under and in general alignment with the electrical component 62. By passing current through the electrically resistive heating element, the electrical component is heated in a direct manner.

Accordingly, the heating apparatus and associated multilayer circuit board of the present invention heats electrical components, such as the electrical components mounted upon the multilayer circuit board, in an efficient and uniform manner. As such, the temperature of the electrical components can be maintained above a predetermined minimum operating temperature, such as 0° C., such that the electrical components will continue to operate in low temperature environments.

In the drawings and the specification, there has been set forth preferred embodiments of the invention, and, although specific terms are employed, the terms are used in a generic and descriptive sense only and not for the purpose of limitation, the scope of the invention being set forth in the following claims.

That which is claimed is:

1. A multilayer circuit board comprising:
   a trace layer having at least one electrical trace terminating with a contact pad that is positioned to electrically contact a respective lead of an electrical component mounted upon the multilayer circuit board; and
   a heating layer disposed in thermal contact with the electrical component mounted upon the multilayer circuit board, said heating layer comprising an electrically insulating substrate and first and second electrically resistive heating elements disposed in a same predetermined area on said substrate and in general alignment with the electrical component mounted upon the multilayer circuit board, wherein at least one of said heating elements has a defined pattern having at least one fractal curve, and wherein both of said heating elements are intertwined such that either of said heating elements will uniformly heat the electrical component mounted upon the multilayer circuit board.

2. A multilayer circuit board according to claim 1 wherein said first electrically resistive heating element further comprises:
   first and second opposed ends for electrical connection a first power source; and
   an element body extending between and electrically connecting said first and second opposed ends.

3. A multilayer circuit board according to claim 2 wherein said first power source is a variable power source for providing variable power to said first electrically resistive heating element.

4. A multilayer circuit board according to claim 2 wherein said element body of said first electrically resistive heating element defines a pattern within the predetermined area of said substrate in general alignment with the electrical component mounted upon the multilayer circuit board.

5. A multilayer circuit board according to claim 4 wherein the pattern defined by said element body of said first electrically resistive heating element includes at least one rectilinear Hilbert fractal curve.

6. A multilayer circuit board according to claim 1 wherein said second electrically resistive heating element further comprises:
   first and second opposed ends; and
   an element body extending between and electrically connecting said first and second opposed ends.

7. A multilayer circuit board according to claim 6 wherein first and second opposed ends of said second electrically resistive heating element are connected to a second power source.

8. A multilayer circuit board according to claim 6 wherein said element body of said second electrically resistive heating element defines a pattern within the predetermined area of said substrate in general alignment with the electrical component mounted upon the multilayer circuit board.

9. A multilayer circuit board according to claim 8 wherein the pattern defined by said element body of said second electrically resistive heating element includes at least one rectilinear Hilbert fractal curve.

10. A multilayer circuit board according to claim 6 wherein said first end of said first electrically resistive heating element and said first end of said second electrically resistive heating element are in electrical connection with the first power source, and wherein said second end of said first electrically resistive heating element is in electrical connection with said second end of said second electrically resistive heating element such that said first and second electrically resistive heating elements are electrically connected in series.

11. An apparatus for heating of an electrical component, the apparatus comprising:

an electrically insulating substrate for mounting in thermal contact with the electrical component; and a first electrically resistive heating element disposed upon said substrate, wherein said first electrically resistive heating element includes first and second opposed ends and an element body extending between and electrically connecting said first and second ends of said first electrically resistive heating element, wherein said element body defines a pattern having at least one fractal curve, wherein said heating element is within a predetermined area of said substrate and is adapted to be in general alignment with the electrical component, and wherein said heating element substantially approximates the size and shape of the predetermined area such that said heating element provides substantially uniform heat to the electrical component.

12. An apparatus according to claim 11 wherein said first and second opposed ends of said first electrically resistive heating element are in electrical contact with a first power source.

13. An apparatus according to claim 11 wherein the pattern defined by said element body of said first electrically resistive heating element includes at least one rectilinear Hilbert fractal curve.

14. An apparatus according to claim 11 wherein said apparatus further comprises a second electrically resistive heating element disposed upon said substrate.

15. An apparatus according to claim 14 wherein said second electrically resistive heating element further comprises:

first and second opposed ends; and an element body extending between and electrically connecting said first and second opposed ends.

16. An apparatus according to claim 14 wherein first and second opposed ends of said second electrically resistive heating element are connected to a second power source.

17. An apparatus according to claim 14 wherein said first end of said first electrically resistive heating element and said first end of said second electrically resistive heating element are in electrical connection with the first power source, and resistive heating element is in electrical connection with said second end of said second electrically resistive heating element such that said first and second electrically resistive heating elements are electrically connected in series.

18. An apparatus for heating an electrical component, the apparatus comprising:

an electrically insulating substrate having at least one electrical trace terminating with a contact pad;

an electrical component mounted upon said electrically insulated substrate, said electrical component having at least one electrical lead that electrically contacts said contact pad of said; and an electrically resistive heating element having a defined pattern with at least one fractal curve, wherein said heating element is disposed upon said substrate, wherein said electrically resistive heating element underlies and is in general alignment with said electrical component, and wherein the defined pattern of said heating element is such that said heating element provides substantially uniform heat to said electrical component while reducing the introduction of electrical noise by said heating element to said electrical component.

19. An apparatus according to claim 18 wherein said electrically resistive heating element further comprises:

first and second opposed ends for electrical connection a power source; and an element body extending between and electrically connecting said first and second opposed ends.

20. An apparatus according to claim 19 wherein the pattern defined by said element body of said electrically resistive heating element includes at least one fractal curve.

21. An apparatus according to claim 20 wherein the pattern defined by said element body of said electrically resistive heating element includes at least one rectilinear Hilbert fractal curve.

\* \* \* \* \*